United States Patent [19]

Kamiyama

[11] Patent Number: 5,508,221

[45] Date of Patent: *Apr. 16, 1996

[54] METHOD FOR FORMING CAPACITOR ELEMENT OF DRAM

[75] Inventor: Satoshi Kamiyama, Tokyo, Japan

[73] Assignee: NEC Corporation, Tokyo, Japan

[ * ] Notice: The term of this patent shall not extend beyond the expiration date of Pat. No. 5,352,623.

[21] Appl. No.: 353,204

[22] Filed: Dec. 1, 1994

[30] Foreign Application Priority Data

Dec. 2, 1993 [JP] Japan ................... 5-302472

[51] Int. Cl.$^6$ ............. H01L 21/70; H01L 27/00
[52] U.S. Cl. ................ 437/60; 437/48; 437/52; 437/919
[58] Field of Search .................. 437/48, 52, 60, 437/919, 235

[56] References Cited

U.S. PATENT DOCUMENTS 5,336,638  8/1994  Suzuki et al. .................. 437/60
5,349,494  9/1994  Ando ........................... 437/60
5,352,623  10/1994  Kamiyama ..................... 437/235

*Primary Examiner*—Tuan H. Nguyen
*Attorney, Agent, or Firm*—Popham, Haik, Schnobrich & Kaufman, Ltd.

[57] ABSTRACT

A stacked capacitor element for a DRAM cell is formed as follows. After a naturally oxidized film on a surface of a polycrystalline silicon film is removed, the polycrystalline silicon film is subjected to a rapid thermal nitriding treatment using lamp annealing so that a capacitor lower electrode of the capacitor element is formed. A tantalum oxide film is deposited on the polycrystalline silicon film and then densified so that a dielectric film of the stacked capacitor element is formed. A conductive film is formed on the tantalum oxide film and patterned. The conductive film is nittided so that a capacitor upper electrode is formed. The capacitor element thus formed enables the suppression of reduction in the capacitance value of the capacitor element of a DRAM and deterioration of the leakage current characteristics.

6 Claims, 5 Drawing Sheets

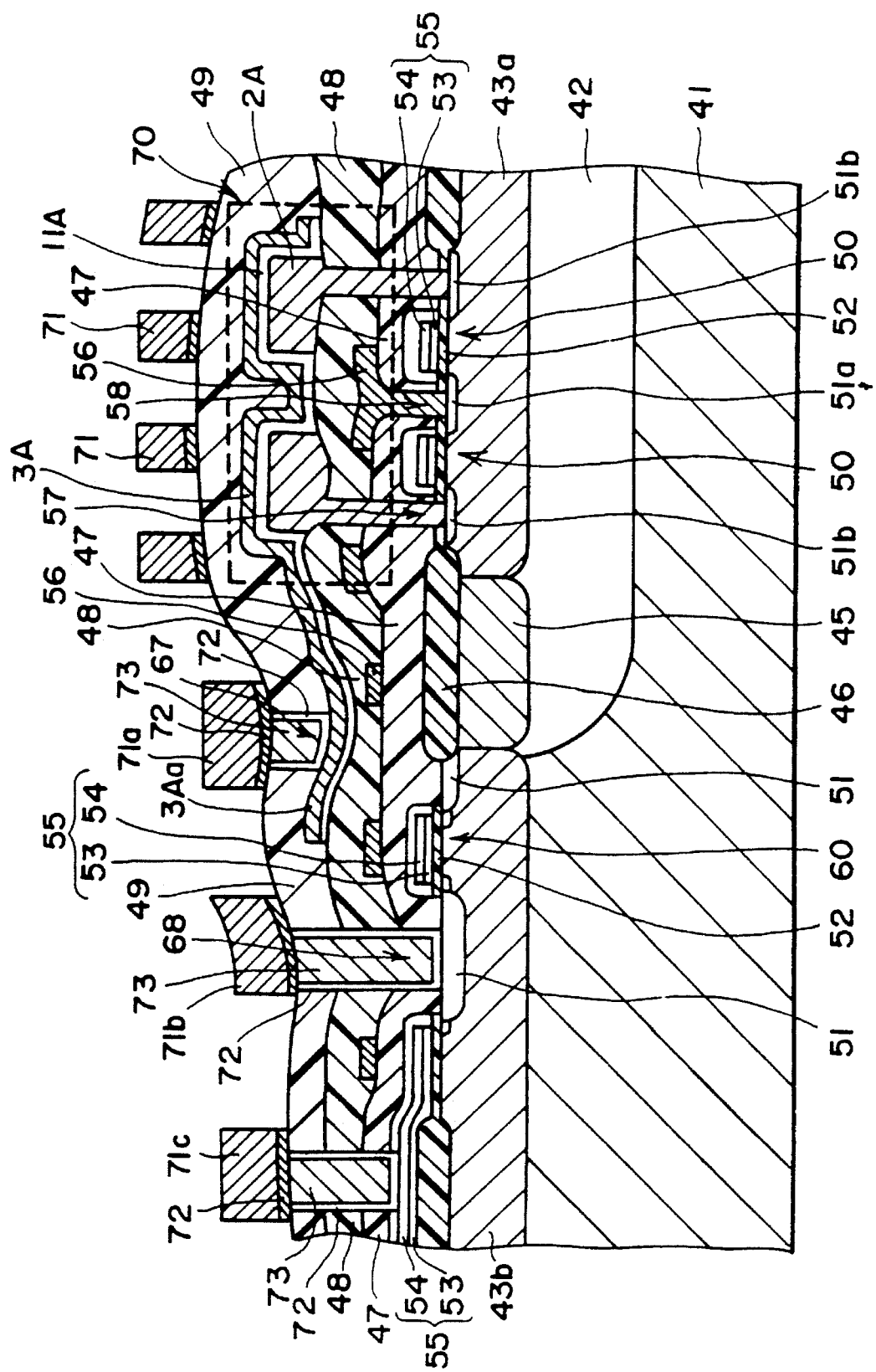

METHOD FOR FORMING CAPACITOR ELEMENT OF DRAM

BACKGROUND OF THE INVENTION

(1) Field of the Invention

The present invention relates to a method for fabricating a semiconductor device, and more particularly to a method for fabricating a capacitor element of a Dynamic Random Access Memory (DRAM) in which a tantalum oxide film is used as a capacitance insulating film.

(2) Description of the Related Art

With respect to capacitor elements in VLSIs beyond 256 megabit DRAM, study is underway as to the employment of capacitance insulating films having a high dielectric constant capable of increasing the capacitance value per unit area. Among such capacitance insulating films, a tantalum oxide film formed by a Chemical Vapor Deposition (hereinafter referred to as "CVD") process is more widely being studied because the relative dielectric constant or thereof is as large as 25~30, the film has excellent step coverage properties, and the method for forming this film is extremely easy as compared with other insulating films having a high dielectric constant.

With reference to FIGS. 1A–1C which show in sectional views a capacitor element in a conventional DRAM cell, an explanation is made hereinafter as to the steps of fabricating a stacked type capacitor element for the conventional DRAM wherein a tantalum oxide film is used as a capacitance insulating film.

First, the structure formed is as follows. A transistor is formed on a surface of a p-type silicon substrate. This transistor is covered by an interlayer insulating film 47. A contact hole 58 is opened in the interlayer insulating film 47 in such a way as to extend to one of n-type source/drain regions of the transistor. A bit line 56, which is connected to the n-type source/drain region through the contact hole 58, is formed on a surface of the interlayer insulating film 47. An interlayer insulating film 48 is formed so as to cover the upper surfaces which include the surface of the bit line 56.

In the structure as above, another contact hole 57 is formed, which extends to the other of the source/drain regions of the transistor passing through the interlayer insulating films 48 and 47. On the entire surface, a polycrystalline silicon film doped with phosphorous (P) is formed, and this polycrystalline silicon film is patterned to form a capacitance lower electrode 2. Then, by a low pressure CVD process using a pentaethoxytantalum ($Ta(OC_2H_5)_5$) gas, which is an organic material, and oxygen, a tantalum oxide film 11 is formed on a surface of the interlayer insulating film 48 including that of the capacitance lower electrode 2 (see FIG. 1A). Next, this tantalum oxide film 11 is heat-treated at a high temperature in an oxygen atmosphere in order to improve its leakage current characteristics, whereby the tantalum oxide film 11 becomes a tantalum oxide film 11B (see FIG. 1B). The heat-treating temperature is generally 700–900° C. This is followed by the formation of a capacitance upper electrode 3 (see FIG. 1C). This capacitance upper electrode 3 employs a titanium nitride film, tungsten film or a polycrystalline silicon film.

The conventional capacitor element fabricated as above includes the following problems. During the process of fabricating the conventional capacitor element, the tantalum oxide film 11 is formed on the surface of the polycrystalline silicon film constituting the capacitance lower electrode 2 and, in order to improve the leakage current characteristics, the high temperature heat treatment is carried out in an oxygen atmosphere for the tantalum oxide film 11 to become the tantalum oxide film 11B. In the capacitor element having the capacitance insulating film formed in the above process, the capacitance value attained amounts only to a value ($Cs=11.5$ $fF/\mu^2$) which is attained when the thickness is about 3 nm in terms of an equivalent silicon oxide film thickness (relative dielectric constant of a silicon oxide film being $\epsilon r=3.9$). This is due to the reason that, during the high temperature heat-treatment conducted in the oxygen atmosphere, a thick silicon oxide film having a thickness of about 2 nm is formed at an interface between the tantalum oxide film 11B and the capacitance lower electrode 2. If such a capacitance insulating film (in which the silicon oxide film having a thickness of about 2 nm and the tantalum oxide film 11B are stacked) is applied to a capacitor element such as that for a 256 megabit DRAM, it is not possible to attain a sufficient capacitance value.

Furthermore, with the leakage current characteristics of the capacitor element formed by the conventional technology, the voltage at which the leakage current density J is $10^{-8}$ $A/cm^2$ is as small as about 0.7 V so that such a capacitor element lacks characteristics sufficiently adaptable to a practical device. Also, where a high temperature heat-treatment such as activation of ion implantation or reflow of an interlayer insulating film is carried out after the formation of the capacitor element, there will be a further deterioration in the leakage current characteristics.

SUMMARY OF THE INVENTION

An object of the invention, therefore, is to overcome the problems existing in the prior art and to provide a method for fabricating a capacitor element of a dynamic random access memory (DRAM) in which a tantalum oxide film is used as a capacitance insulating film and with which it is possible to suppress the reduction in the capacitance value of the capacitor element of a DRAM and the deterioration of the leakage current characteristics.

According to one aspect of the invention, there is provided a method for fabricating a stacked capacitor element of a semiconductor device, the stacked capacitor element having a capacitor lower electrode and a capacitor upper electrode with a dielectric film being interposed therebetween, the method comprising the steps of:

removing a naturally oxidized film on a surface of a polycrystalline silicon film constituting the capacitor lower electrode, and nitriding the surface of the polycrystalline silicon film by a rapid thermal nitriding treatment using lamp annealing;

forming a tantalum oxide film on the polycrystalline silicon film and densifying the tantalum oxide film to form the dielectric film;

forming a conductive film, on the tantalum oxide film, constituting the capacitor upper electrode; and nitriding the conductive film after having been patterned.

Preferably, the step of removing the naturally oxidized film is carried out by a treatment using hydrofluoric anhydride or diluted hydrofluoric acid. Also, preferably, the tantalum oxide film is formed by the CVD process using an organic tantalum material. Further, preferably, the densifying treatment of the tantalum oxide film is carried out by a treatment in an oxygen atmosphere or a nitrous oxide atmosphere using at least one of an electric furnace heat treatment, a rapid thermal treatment using lamp heating, and a plasma-assisted heat treatment. The conductive film constituting the capacitor upper electrode may contain at least one of a titanium nitride film, a tungsten nitride film, and a molybden nitride film. Furthermore, the nitriding treatment of the conductive film may be a plasma treatment in one of an ammonium atmosphere, a nitride atmosphere and a nitrous oxide atmosphere.

BRIEF DESCRIPTION OF THE DRAWINGS

FIG. 2 is a diagrammatical sectional view showing a semiconductor device according to the present invention;

PREFERRED EMBODIMENT OF THE INVENTION

Figure 1A:
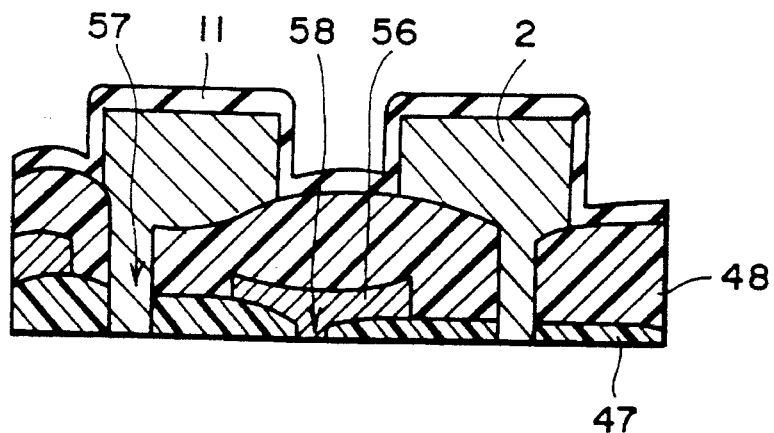
FIGS. 1A–1C are sectional views showing a capacitor element in a conventional DRAM cell.
Figure 1B:
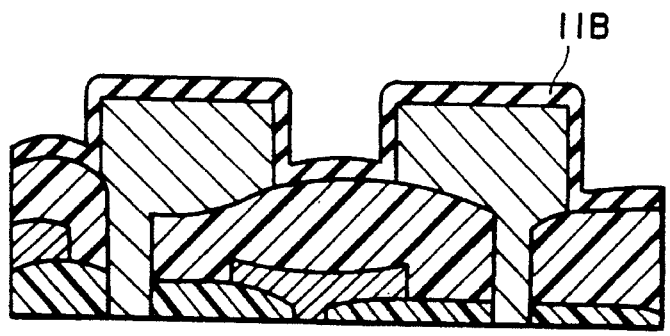
Figure 1C:
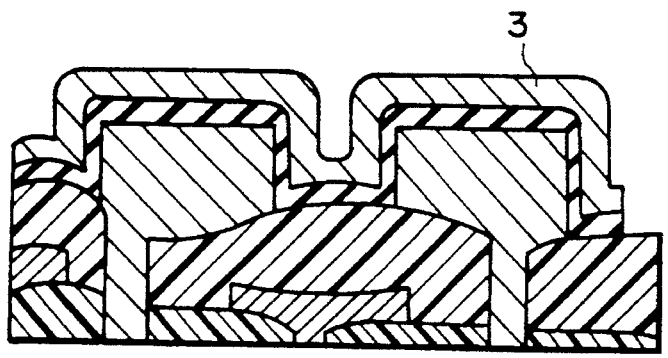

Now, a preferred embodiment of the invention is explained with reference to the drawings. Before the embodiment is explained, the explanation is made of a semiconductor device to which the embodiment of the invention is applied.

As seen in a diagrammatic sectional view of FIG. 2 which shows a semiconductor device according to the present invention, the DRAM to which the embodiment of the invention is applied is configured as explained hereinafter.

An n-type well 42 is formed in a surface of a p-type silicon substrate 41, a first p-type well 43a is formed on a surface of the n-type well 42, and an n-type isolation region 45 is formed on a surface of an edge portion of the n-type well 42. On the surface of the p-type silicon substrate 41, except the n-type well 42, a second p-type well 43b is formed. The p-type well 43a and the p-type well 43b are isolated from each other by the n-type isolation region 45 and the field oxide film 46 provided on the n-type isolation region 45.

On a surface of the first p-type well 43a, there are formed transistors 50 which constitute a memory cell on active regions which are isolated by the field oxide film 46. FIG. 2 shows only one pair of such memory cells. Each of such transistors 50 is constituted by n-type source/drain regions 51a and 51b which are provided on the surface of the p-type well 43a, a gate insulating film 52 which is provided on the surface of the p-type well 43a, and a gate electrode 55 in which a polycrystalline silicon film 53 and a silicide film 54 are stacked and provided above the p-type well 43a with the gate insulating film 52 interposed therebetween. Each transistor 50 is covered with a first interlayer insulating film 47. This interlayer insulating film 47 is provided with a contact hole 58 which reaches the source/drain region 51a which is common to the paired transistors 50. A bit line 56 provided on the surface of the interlayer insulating film 47 is connected to the source/drain region 51a through the contact hole 58.

The bit line 56 is covered with a second interlayer insulating film 48. On the interlayer insulating film 48, there is a capacitor element portion 70 (enclosed in a dotted line box). Specifically, the stacked type capacitor element in this embodiment is constituted by a capacitor lower electrode 2A, a tantalum oxide film 11A as a capacitor insulating film, and a capacitor upper electrode 3A. Each of the paired capacitor lower electrodes 2A is connected with a respective one of the source/drain regions 51b through a respective one of the contact holes 57 each extending, penetrating through the interlayer insulating films 48 and 47, to the n-type source/drain regions 51b of the paired transistors 50. The capacitor upper electrode 3A is formed continuously in common to the respective capacitor elements of the paired memory cells. The capacitor upper electrode 3A extends over the second interlayer insulating film 48 and is provided with a capacitor upper electrode 3Aa which serves as a lead-out portion for connection with an upper wiring layer.

The capacitor element portion 70 is covered with a third interlayer insulating film 49. One aluminum electrode 71a out of a plurality of aluminum electrodes 71 provided on a surface of the interlayer insulating film 49 is connected to the capacitor upper electrode 3Aa through a contact hole 67 provided in the interlayer insulating film 49. The potential of the aluminum electrode 71a is set to a fixed potential such as the ground potential. Side and bottom surfaces of the contact hole 67 are covered with a titanium nitride film 72, and the contact hole 67 is filled with a tungsten film 73. Also, bottom surfaces of the aluminum electrodes 71, etc. are provided with the titanium nitride film 72.

On the other hand, a transistor 60 which constitutes a peripheral circuit of a memory device comprises n-type source/drain regions 51 which are provided in a surface region of the p-type well 43b, a gate insulating film 52 which is provided on a surface of the p-type well 43b, and a gate electrode 55 in which the polycrystalline silicon film 53 and the silicide film 54 are stacked above the surface of the p-type well 43b with the gate insulating film 52 interposed therebetween. An aluminum electrode 71b is connected to one of the source/drain regions 51 through a contact hole 68 penetrating through the interlayer insulating films 49, 48 and 47. This contact hole 68 is, in the same way as in the contact hole 67, covered at its side and bottom surfaces with the titanium nitride film 72 and is filled with the tungsten film 73. Likewise, the gate electrode 55 of other transistor 60 of the peripheral circuit is connected to an aluminum electrode 71c through a contact hole.

Now, a first embodiment of the invention is explained with reference to FIGS. 3A–3D which are enlarged partial views of a capacitor element portion 70 shown in FIG. 2 and which are used for explaining the steps of a process for fabricating a semiconductor device, and FIG. 4 which is a diagrammatic section view of a chemical vapor deposition apparatus.

First, the second interlayer insulating film 48 is formed, and the contact hole 57 penetrating through the interlayer insulating films 48 and 47 is formed. Then, by a chemical vapor deposition (CVD) process, a polycrystalline silicon film is deposited, and this polycrystalline silicon film, after being doped with phosphorus, is patterned whereby the capacitor lower electrode 2 is formed (see FIG. 3A). The material to fill inside the contact hole 57 may be the polycrystalline silicon film that is provided for forming the capacitor lower electrode 2 and is doped with phosphorus, but may well be a film such as an n-type polycrystalline silicon film or a tungsten film formed separately in advance.

Figure 3A:
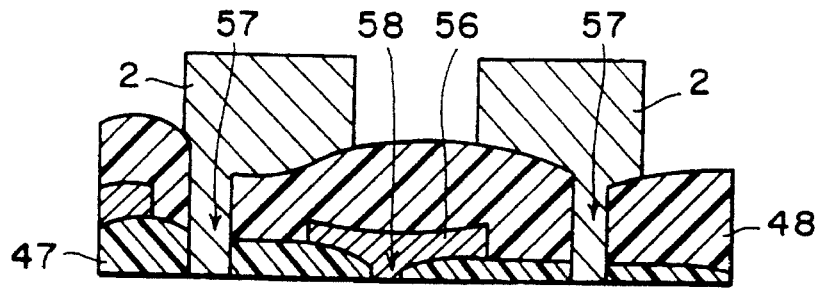
FIGS. 3A–3D are enlarged partial views of a capacitor element shown in FIG. 2.
Figure 3B:
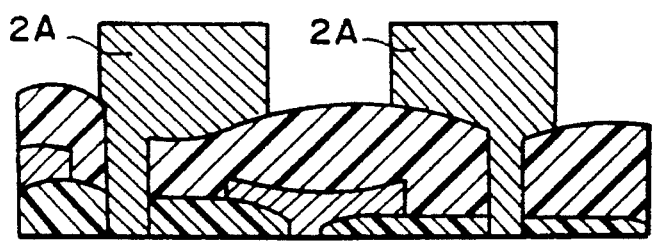
Figure 4:
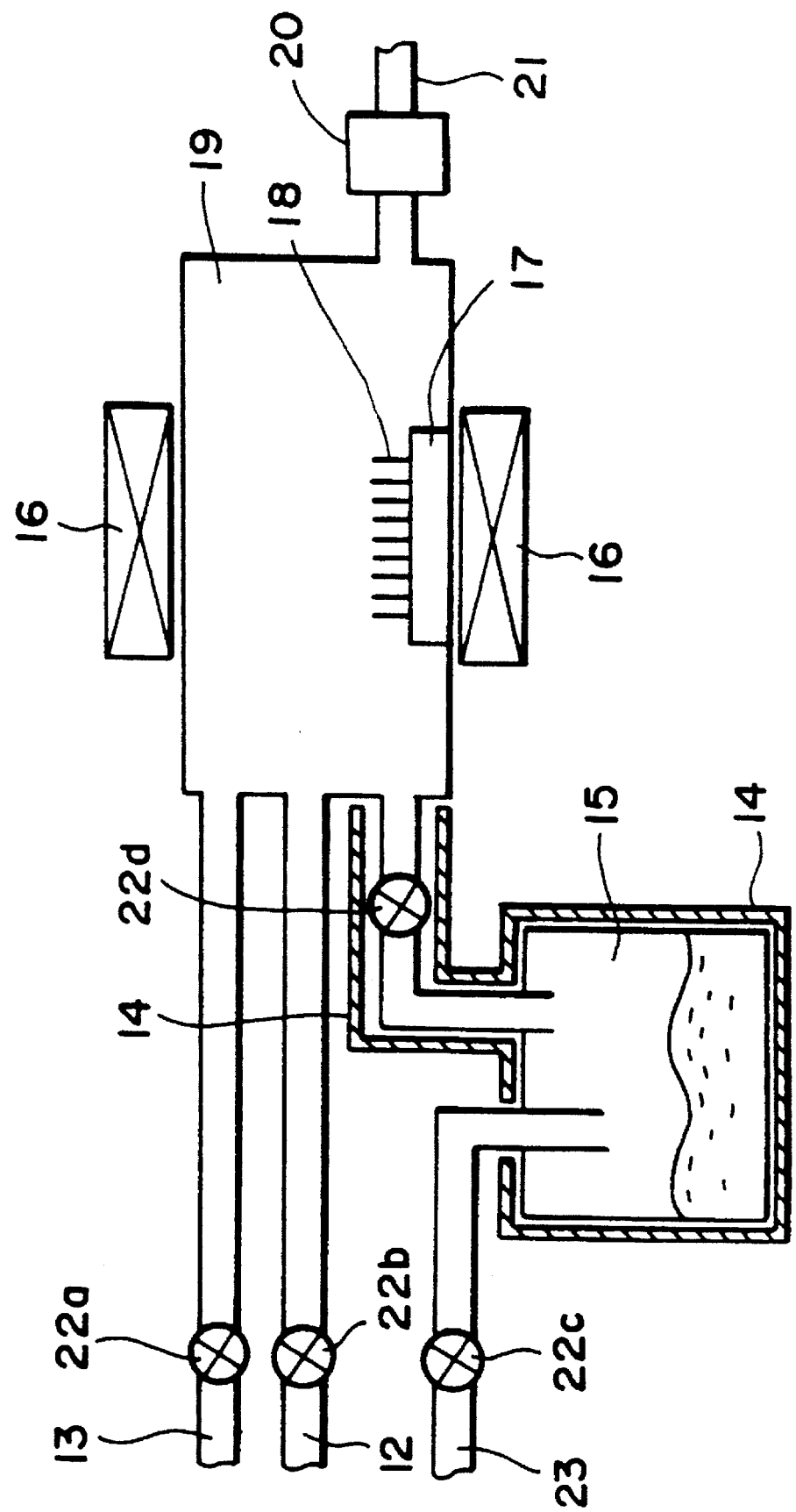
FIG. 4 is a diagrammatical sectional view of a chemical vapor deposition apparatus.

Next, after a naturally oxidized film on a surface of the capacitor lower electrode 2 is removed by diluted hydrofluoric acid, a rapid thermal nitriding (RTN) treatment using lamp annealing is carried out, and a surface of the polycrystalline silicon constituting the capacitor lower electrode 2 is nitrided thereby forming thereon a silicon nitride film ($SiN_x$) (not shown), whereby the capacitor lower electrode 2 is converted to a capacitor lower electrode 2A (see FIG. 3B). The RTN treatment may preferably be carried out in an ammonium gas ($NH_3$) with a temperature suitably being 800°~1100° C. For removing the naturally oxidized film, hydrofluoric anhydride may be used.

Then, a tantalum oxide film (not shown) is formed on the surface of the interlayer insulating film 48 including the surface of the capacitor lower electrode 2A by the CVD process. In forming this film, a low pressure chemical vapor deposition (LPCVD) apparatus as shown in FIG. 4 is used. The source gas may use a pentaethoxytantalum ($Ta(OC_2H_5)_5$) gas and oxygen. The pentaethoxytantalum gas in which the pentaethoxytantalum is gasified in a gasifying chamber 15 by a heater 14 is introduced into a reaction furnace 19, in which a substrate holder 17 carrying a semiconductor wafer 18 is placed, through a valve 22*d* by an argon gas which is a carrier gas conveyed through a valve 22*c* from a duct 23 of the carrier gas argon. At the same time, the oxygen gas is introduced into the reaction furnace 19 through a valve 22*b* from a duct 12 of the oxygen gas. The reaction furnace 19 has been heated by a heater 16 so that the introduced organic tantalum gas and the oxygen gas undergo chemical vapor-phase reaction whereby a tantalum oxide film is deposited on a surface of the semiconductor wafer 18. The growth conditions suitable include a heating temperature in the gasifying chamber 15 as being 30°~200° C., a flow rate of the argon gas as a carrier gas as being 10~1000 sccm, a flow rate of the oxygen gas as being 0.1~20 SLM, and a pressure as being $1.3 \times 10^2$~$1.3 \times 10^4$ Pa. In addition to the ducts 12 and 23, another duct 13 for introducing the argon gas is connected to the reaction furnace 19, and the argon gas is introduced therein through a valve 22*a*. Also, a vacuum pump 20 having an exhaust port 21 is connected to the reaction furnace 19.

Figure 3C:
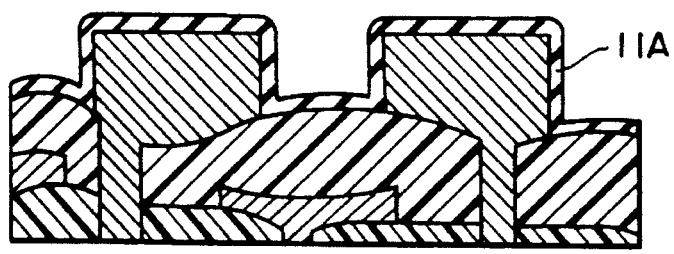
Figure 3D:
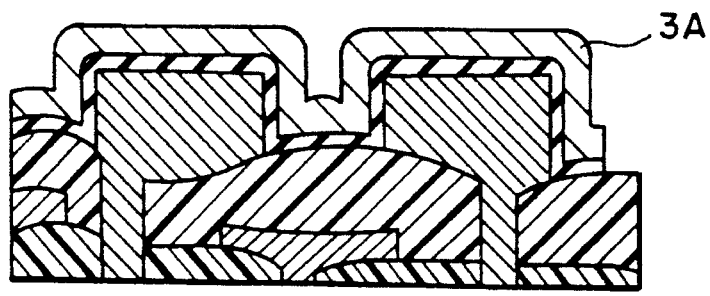

After the tantalum oxide film is deposited, this film is subjected to a densifying treatment whereby a tantalum oxide film 11A is formed (see FIG. 3C). This treatment is carried out either in an oxygen atmosphere or nitrous oxide ($N_2O$) atmosphere using at least one heat treatment from among an electric furnace heat treatment, a rapid thermal oxidizing (RTO) using lamp heating, and a plasma-assisted heat treatment.

Following the above, a titanium nitride film (not shown) is deposited on the entire surface, and this film (and the tantalum oxide film 11A) is patterned. Further, the nitriding treatment is carried out, and a capacitor upper electrode 3A constituted by the titanium nitride film is formed (see FIG. 3D). This nitriding treatment is a plasma treatment using an ammonium gas. The conditions suitable include the temperature as being the room temperature ~600° C., the pressure as being $1.3 \times 10^2$~$1.3 \times 10^4$ Pa, the power as being 50~500 W. As the gas for this purpose, a nitrogen gas or a nitrous oxide ($N_2O$) gas may be used.

In the embodiment explained above, the titanium nitride film is used as the capacitor upper electrode 3A, but the film is not limited to such a film in this invention. It may be a stacked layer film in which the titanium nitride film is made a lower most film, or a stacked layer film in which the tungsten nitride film or the tungsten nitride film is made a lower most film.

The above is followed by the deposition and reflow of the third interlayer insulating film 49, the formation of the contact holes 67, 68, etc., the formation of a contact phosphorus diffusion layer, and the formation of the aluminum electrodes 71, 71*a*, 71*b*, 71*c*, etc. (see FIG. 2), whereby the DRAM is completed. As for the high temperature heat treatment after the formation of the capacitor element portion 70, there are treatments such as a reflow process of the interlayer insulating film 49 and an activation process for forming a contact phosphorus diffusion layer on a bottom surface of the contact hole 68, with the temperature being about 700°~850° C.

The capacitance value of the capacitor element fabricated according to the embodiment of the invention amounts to a value ($Cs=13.8$ fF/$\mu m^2$) when the thickness is about 2.5 nm in terms of the equivalent silicon oxide film, which value is larger than the capacitance value of the capacitor element fabricated using a conventional technology. This is because the surface of the polycrystalline silicon film constituting the capacitor lower electrode 2A is nitrided by the RTN treatment, and the oxidation of the surface of the polycrystalline silicon film is suppressed during the densifying treatment (oxidizing treatment) for forming the tantalum oxide film 11A. This densifying treatment is carried out for enhancing the leakage current characteristics of the tantalum oxide film.

Figure 5:
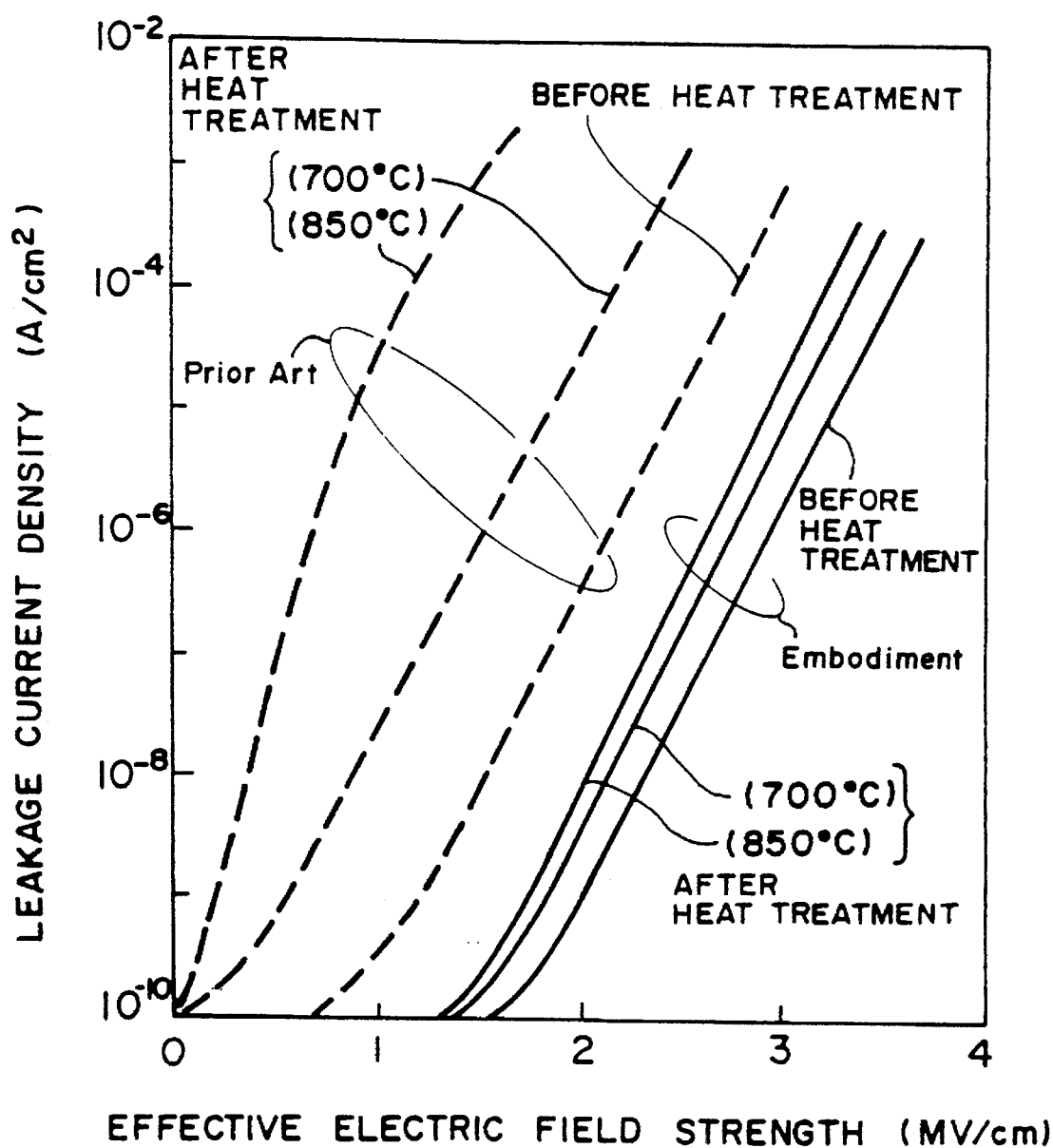
FIG. 5 is a graph showing leakage current characteristics obtained by adopting the embodiment of the present invention.

A graph of leakage current characteristics in FIG. 5 shows the leakage current characteristics obtained by adopting the embodiment of the invention. In the graph, in order to demonstrate the effect of the embodiment, the leakage current characteristics of the capacitor element fabricated using a conventional technology (here, the capacitor upper electrode 3 has been formed by a titanium nitride film) are also shown. The graph also compares the leakage current characteristics of the capacitor element of the present invention and those of the prior art, before and after the high temperature heat treatment (reflowing, activating, etc.).

The graph shows that, before the high temperature heat treatment, the leakage current characteristics of the capacitor element according to the embodiment are better than those of the prior art capacitor element. This has a good correlation with the presence and non-presence of the naturally oxidized film on the surface of the capacitor lower electrode. The naturally oxidized film in its film quality is regarded as insufficient as an electric insulating film. In this embodiment, this naturally oxidized film is removed, and a silicon nitride film of good quality is formed as the electric insulating film on the surface of the capacitor lower electrode 2A by the RTN treatment.

It is seen in the graph that, after the high temperature heat treatment, the leakage current characteristics of the capacitor element fabricated by the conventional technology deteriorate with the rise of the thermal treatment temperature. This is because the titanium nitride film (constituting the capacitor upper electrode 3) and the tantalum oxide film 11 react with each other during the heat treatment. On the other hand, the leakage current characteristics of the capacitor element according to the embodiment of the invention do not show any distinct deterioration even after the heat treatment. This is thought to be due to the reason that the titanium nitride film is nitrided to form the capacitor upper electrode 3A, and this capacitor upper electrode 3A is constituted by the titanium nitride film which is stoichiometric, whereby the reaction between the titanium nitride film (constituting the capacitor upper electrode 3A) and the tantalum oxide film 11A is suppressed during the high temperature heat treatment.

With the method of fabricating a semiconductor integrated circuit device according to the invention, it is possible to suppress the reduction in the capacitance value of the capacitor element of a DRAM and the deterioration of the leakage current characteristics.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a stacked capacitor element of a semiconductor device, said stacked capacitor element having a capacitor lower electrode and a capacitor upper electrode with a dielectric film being interposed therebetween, said method comprising the steps of:

removing a naturally oxidized film on a surface of a polycrystalline silicon film constituting said capacitor lower electrode, and nitriding said surface of the polycrystalline silicon film by a rapid thermal nitriding treatment using lamp annealing;

forming a tantalum oxide film on said polycrystalline silicon film and densifying said tantalum oxide film to form said dielectric film;

forming a conductive film, on said tantalum oxide film, constituting said capacitor upper electrode; and nitriding said conductive film after having been patterned.

2. The method for fabricating a stacked capacitor element according to claim 1, in which said step of removing the naturally oxidized film is a treatment using one of hydrofluoric anhydride and a diluted hydrofluoric acid.

3. The method for fabricating a stacked capacitor element according to claim 1, in which the step of forming said tantalum oxide film is a chemical vapor deposition using an organic tantalum material.

4. The method for fabricating a stacked capacitor element according to claim 1, in which said densifying treatment of said tantalum oxide film is a treatment carried out in one of an oxygen atmosphere and a nitrous oxide atmosphere using at least one of an electric furnace heat treatment, a rapid thermal treatment using lamp heating, and a plasma assisted heat treatment.

5. The method for fabricating a stacked capacitor element according to claim 1, in which said conductive film constituting said capacitor upper electrode contains at least one of a titanium nitride film, a tungsten nitride film, and a molybden nitride film.

6. The method for fabricating a stacked capacitor element according to claim 1, in which said nitriding treatment of said conductive film is a plasma treatment in one of an ammonium atmosphere, a nitride atmosphere and a nitrous oxide atmosphere.

* * * * *